United States Patent
Mandell et al.

(10) Patent No.: US 6,477,689 B1
(45) Date of Patent: Nov. 5, 2002

(54) ARCHITECTURAL STRUCTURE OF A PROCESS NETLIST DESIGN TOOL

(75) Inventors: Michael I Mandell; Arnold L. Berman, both of Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/880,444

(22) Filed: Jun. 13, 2001

(51) Int. Cl.[7] .............................................. G06F 17/50
(52) U.S. Cl. ........................................... 716/11; 716/18
(58) Field of Search .............................. 716/1, 5, 6, 12, 716/17, 18

(56) References Cited

U.S. PATENT DOCUMENTS

| | | | | |
|---|---|---|---|---|
| 5,727,187 A | * | 3/1998 | Lemche et al. ................ | 716/18 |
| 5,831,869 A | * | 11/1998 | Ellis ............................... | 716/6 |
| 5,933,356 A | * | 8/1999 | Rostoker et al. ............... | 716/6 |
| 6,077,303 A | | 6/2000 | Mandell et al. ................ | 703/14 |
| 6,324,678 B1 | * | 11/2001 | Dangelo et al. .............. | 716/18 |
| 6,366,874 B1 | * | 4/2002 | Lee et al. ....................... | 716/18 |

* cited by examiner

Primary Examiner—Trong Phan
(74) Attorney, Agent, or Firm—Harness Dickey & Pierce P.L.C.

(57) ABSTRACT

A computer-implemented design tool architecture provides a mechanism for characterizing a circuit at a hardware level. The tool architecture has a medium for storing a description of an application specific integrated circuit (ASIC), where the description describes the ASIC at a behavioral level of a hierarchy. A library of foundry primitives map known ASIC components to code sets for a hardware description language (HDL). The tool architecture further includes a command interpreter for generating an electronic file based on a set of predefined computer-based commands such that the electronic file characterizes the circuit at the hardware level. The hardware level is at a lower level in the hierarchy than the behavioral level.

20 Claims, 7 Drawing Sheets

FIG 6
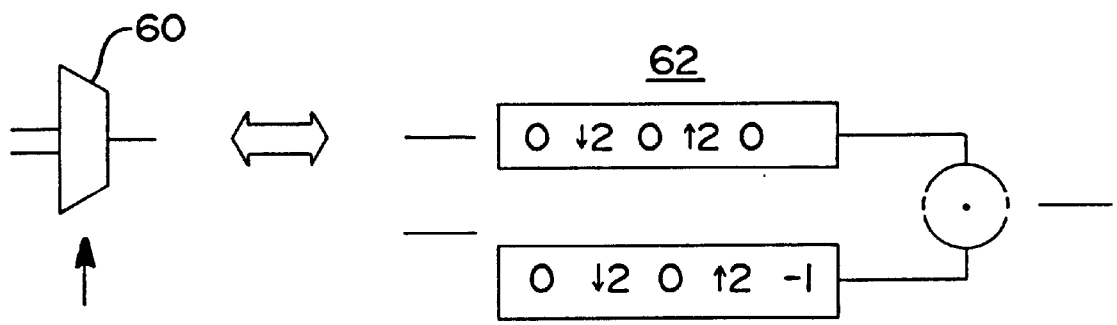
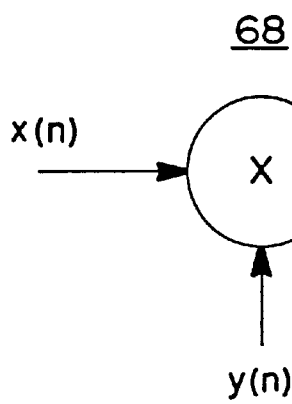
FIG 7A
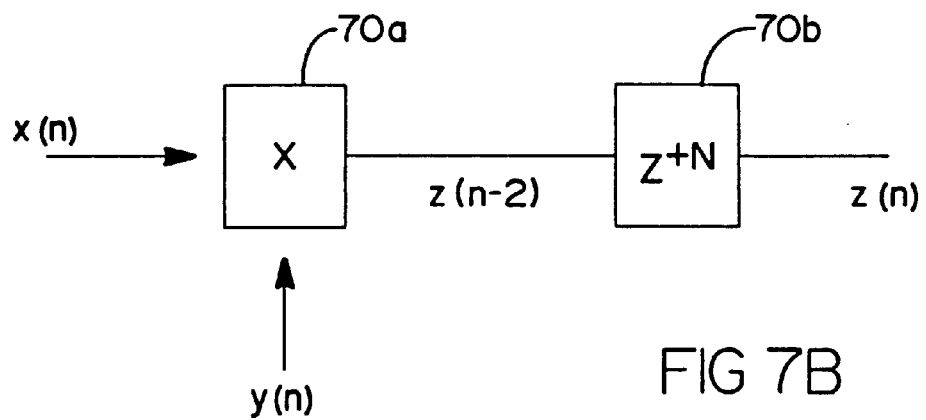
FIG 7B

ARCHITECTURAL STRUCTURE OF A PROCESS NETLIST DESIGN TOOL

BACKGROUND OF THE INVENTION

1. Technical Field

The present invention generally relates to electronic circuit fabrication. More particularly, the present invention relates to a computer-based method and architecture that automatically transforms a behavioral description of a circuit into a hardware level representation of the circuit.

2. Discussion

In order to fabricate an electronic circuit such as an application specific integrated circuit (ASIC) or a field programmable gate array (FPGA), a number of time critical processes must be completed. For example, the first step is to design the circuit at a "behavioral" level. The behavioral level can be viewed as a top level of a hierarchy, in which the hardware level of the hierarchy characterizes the circuit in terms of actual hardware components and is positioned at the bottom of the hierarchy. The behavioral description therefore might be a block diagram or netlist that describes the various functions of the circuit in relatively general terms.

Characterizing the circuit at the hardware level based on the behavioral description is critical in the circuit fabrication process. This is because the generally described functions in the behavioral description do not have enough specificity to fully enable the circuit manufacturer to implement the design. The conventional approach is therefore to manually generate an electronic file that characterizes the circuit at the hardware level in a desired programming language such as the well-known hardware description language (HDL). Thus, a design engineer with intricate knowledge of the electronic principles contained in the circuit as well as the desired programming language must go through the behavioral description on a component-by-component basis and generate the necessary code sets in the desired programming language. It is easy to understand that such an approach is quite labor intensive and subject to human error. It is therefore desirable to provide a mechanism for automatically characterizing a circuit at a hardware level.

Once the electronic file has been manually generated, a complex verification process is also required. Thus, operation of the circuit is simulated by providing the electronic file with a set of predefined inputs. The simulation results are compared with known output values that should have resulted from the simulation process. In the case of the ASIC, a model of the circuit in the well known C programming language is also manually generated to provide a cross-verification mechanism. This is typically required due to the complex nature of the ASIC fabrication process and the resulting need for a high level of certainty as to the functionality of the electronic file. Once again, the manual generation of the C model requires detailed knowledge of the C programming language and results in a significant increase in the labor costs associated with the overall fabrication process. Once the electronic file has been verified, it is typically converted into a format that is conducive to the equipment of the manufacturer using one or more well-known conversion programs such as commercially available Synopsis. After the electronic file has been converted, the manufacturer can engage in various fabrication processes such as liquid or plasma etching in order to fabricate the circuit.

It will be appreciated that the above manual processes add to both the lead time and fabrication costs associated with the circuit. It is therefore desirable to provide a mechanism for mapping known circuit components to a code set for a desired programming language in order to characterize a circuit at a hardware level in the desired programming language based on a behavioral description of the circuit.

SUMMARY OF THE INVENTION

The above and other objectives are provided by a computer-implemented method for characterizing a circuit at a hardware level in accordance with the present invention. The method includes the step of receiving a description of the circuit, where the description characterizes the circuit at a behavioral level of a hierarchy. The method further provides for receiving a set of predefined computer-based commands requesting desired modifications in the description of the circuit. An electronic file is then generated based on the computer-based commands such that the electronic file characterizes the circuit at a hardware level in a desired programming language. The hardware level is at a lower level in the hierarchy than the behavioral level. The use of computer-based commands to automatically generate the electronic file reduces manual labor requirements to levels unachievable through conventional approaches.

Further in accordance with the present invention, a computer-implemented method for generating an electronic file is provided. The method includes the step of implementing desired modifications in a description of a circuit with a set of predefined modules based on computer-based commands and a library of foundry primitives. The foundry primitives map known components to code sets for a desired programming language. A hierarchical netlist is also generated, where the hierarchical netlist represents the circuit at each level in a hierarchy. The method further provides for repeatedly updating the hierarchical netlist in accordance with the modifications.

In another aspect of the invention, a computer-implemented design tool architecture is provided. The architecture includes a medium for storing a description of an application specific integrated circuit (ASIC), where the description describes the ASIC at a behavioral level of a hierarchy. The architecture further includes a library of foundry primitives and a command interpreter. The foundry primitives map known ASIC components to code sets for a hardware description language (HDL). The command interpreter generates an electronic file based on a set of predefined computer-based commands such that the electronic file characterizes the circuit at a hardware level. The hardware level is at a lower level in the hierarchy than the behavioral level.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

BRIEF DESCRIPTION OF THE DRAWINGS

The present invention will become more fully understood from the detailed description and the accompanying drawings, wherein:

FIG. 6 is a block diagram showing a two-way multiplex control counter in accordance with principles of the present invention;

FIG. 7A is a block diagram of an original component before application of an implementation assignment command in accordance with principles of the present invention;

FIG. 7B is a block diagram showing implementation components after application of an implementation assignment command to the original component shown in FIG. 7A.

DETAILED DESCRIPTION OF THE PREFERRED EMBODIMENTS

The following description of the preferred embodiment(s) is merely exemplary in nature and is in no way intended to limit the invention, its application, or uses.

Figure 1:
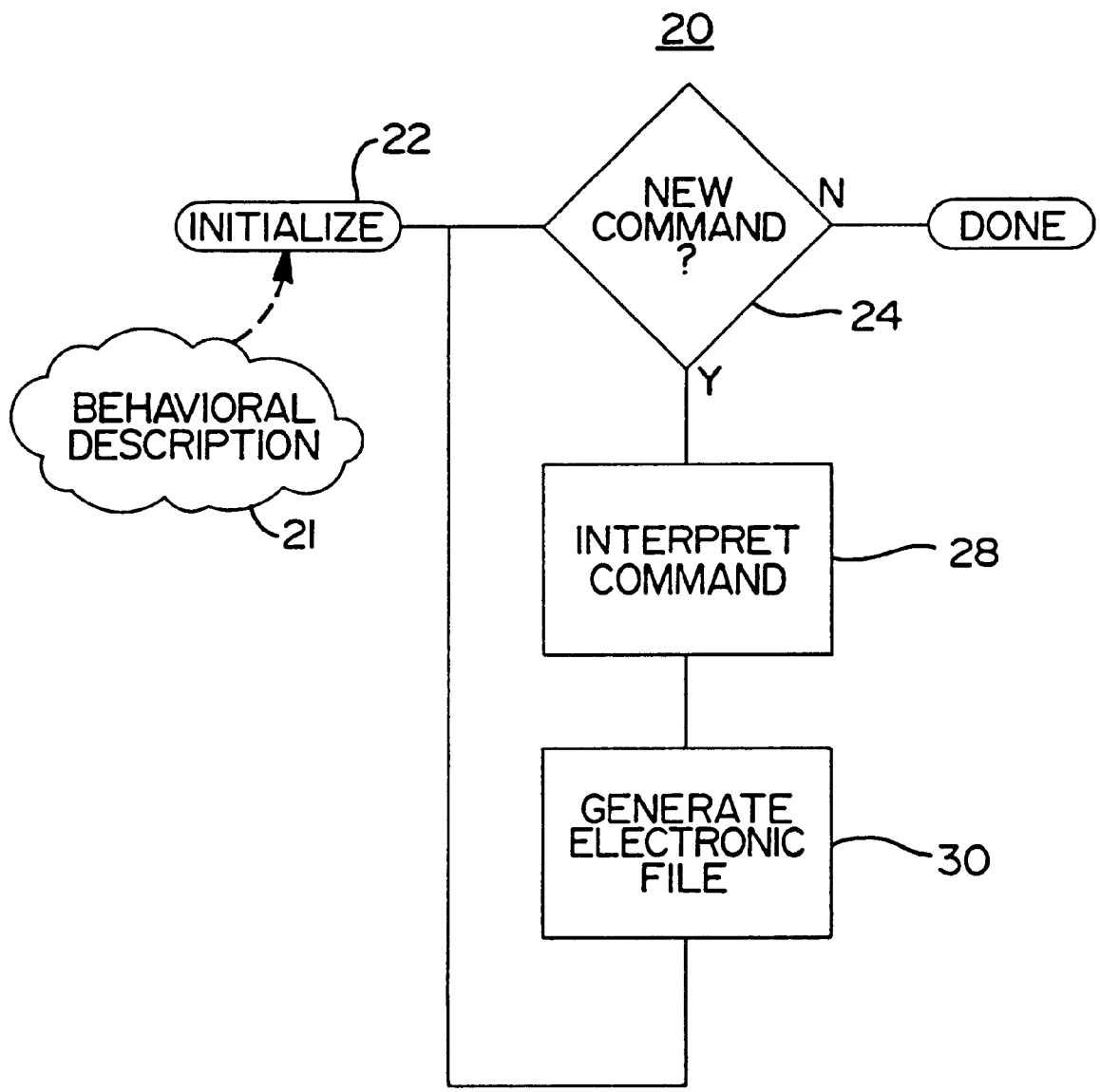
FIG. 1 is a flowchart of a computer-implemented method for characterizing a circuit at a hardware level in accordance with the principles of the present invention.

Turning now to FIG. 1, it can be seen that the present invention generally provides a computer-implemented method 20 for characterizing a circuit (not shown) at a hardware level. It is important to note that the circuit is preferably an application specific integrated circuit (ASIC), but other types of circuits such as a field programmable gate array (FPGA) can also benefit from the present invention. Furthermore, the particular application in which the circuit is used is not critical. Thus, the method 20 has a wide range of expected uses.

Generally, the method 20 includes an initialization step 22 wherein a description 21 of the circuit is received. The description 21 characterizes the circuit at a behavioral level of a hierarchy, and is preferably in the form of either a block diagram or a descriptive netlist. A netlist is a list of names of symbols or parts and their connections to points which are logically connected in each net of a circuit. Netlists can ordinarily be captured from properly prepared schematic drawing files of an electrical computer aided engineering (CAE) application.

Upon receiving a new command at step 24 (from a source such as a user keyboard or script driver input), the predefined computer-based command is interpreted at step 28, where the command requests a desired modification in the description of the circuit. An example modification might be a request to replace a digital filter with a delay chain and multipliers. At step 30, an electronic file is generated based on the computer-based command such that the electronic file characterizes the circuit at the hardware level in a desired programming language. It is important to note that the method 20 is an iterative one, and that the electronic file is "built-up" as commands are received. It is also important to note that the hardware level is located at a lower level in the hierarchy (typically the bottom) than the behavioral level.

Although the desired programming language is preferably the well known hardware description language (HDL), it will be appreciated that the present invention is not so limited. Particularly, in the case of an ASIC, it may be desirable to provide a verification mechanism in the form of a C language file. Simulating the operation of the circuit with the C language file therefore provides a mechanism for crosschecking the HDL file. In such cases, the desired programming language is the C programming language. It is important to note, however, that the present invention provides confirmation algorithms that (depending on the confidence requirements of the application) might obviate the need for the C language file.

Figure 2:
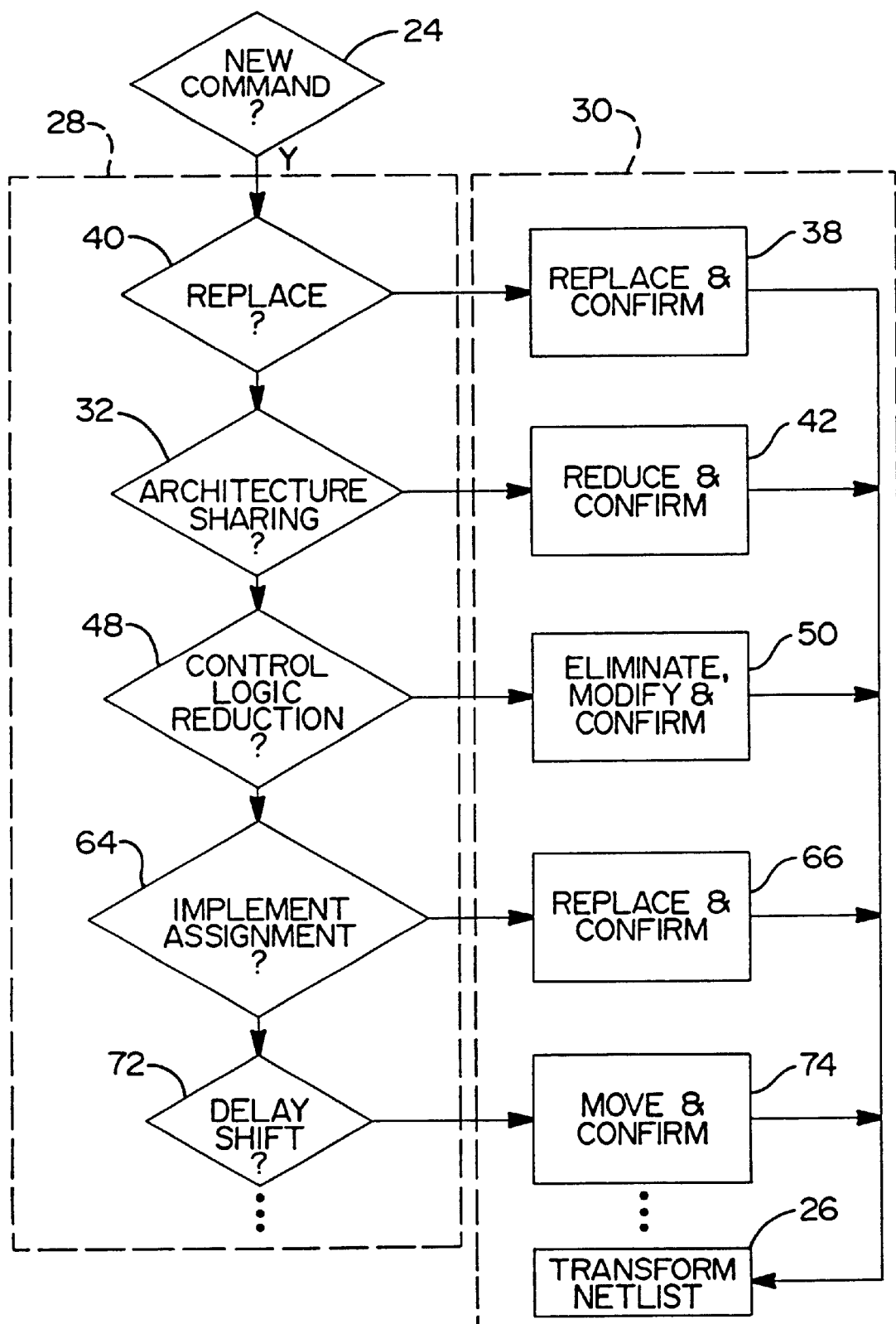
FIG. 2 is a flowchart of a process for implementing desired modifications with a set of predefined modules in accordance with one embodiment of the present invention.

Turning now to FIG. 2, it can be seen that the preferred approach to the step 28 of interpreting the commands provides many useful features. For example, when a replacement command is received at step 40, an original component (e.g., digital filter) of the circuit residing at an original level in the hierarchy will be replaced at step 38 with one or more replacement components (e.g., delay chain and multipliers) residing at a lower level in the hierarchy. Step 38 also provides for confirming that the replacement components are functionally equivalent to the original component with regard to the circuit. Detailed confirmation algorithms will be discussed in greater detail below. At step 26 the hierarchical netlist is transformed (or updated) in accordance with the modifications.

It will be appreciated that an important aspect of ASIC design is the concept of architecture sharing. Architecture sharing generally provides a mechanism for the sharing of physical processing paths by symbolic (logical) processing in order to conserve resources. For example, a block diagram of a circuit at a behavioral level might call for ten multipliers each being clocked at 1 MHz, whereas architecture sharing permits the use of one multiplier operating at 10 MHz. Thus, when it is determined at step 32 that an architecture sharing command has been entered, an original architecture of the circuit is reduced at step 42 such that a reduced architecture results. Furthermore, it can be seen that step 42 provides for confirming that the reduced architecture is functionally equivalent to the original architecture with regard to the circuit.

Figure 3A:
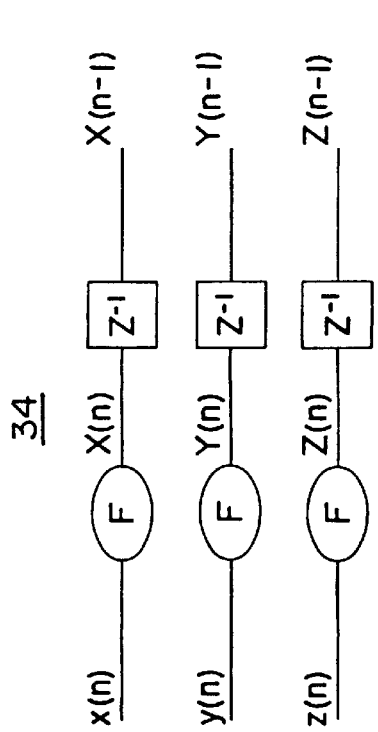
FIG. 3A is a block diagram of an original architecture of a circuit before application of an architecture sharing command in accordance with principles of the present invention.
Figure 3B:
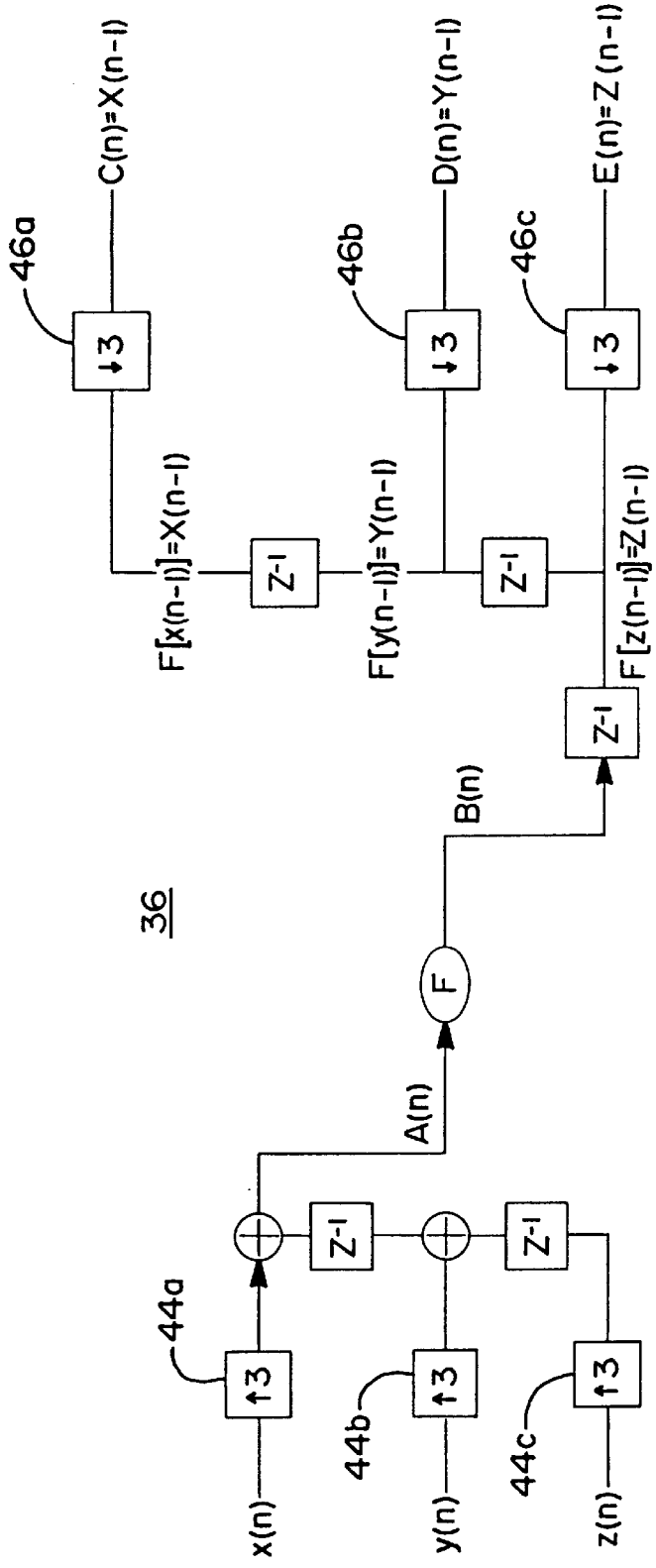
FIG. 3B is a block diagram of a reduced architecture resulting after application of an architecture sharing command to the original architecture of FIG. 3A in accordance with principles of the present invention.

The process of confirming that the reduced architecture is functionally equivalent to the original architecture with regard to the circuit will now be described in greater detail. With continuing reference to FIGS. 3A and 3B, the original architecture 34 will be described for an arbitrary n as follows:

$$X(n) = F[x(n)]; \quad X(n-1) = F[x(n-1)]$$
$$Y(n) = F[y(n)]; \quad Y(n-1) = F[y(n-1)]$$
$$Z(n) = F[z(n)]; \quad Z(n-1) = F[z(n-1)].$$

If the reduced architecture 36 is defined as $$A(n) = \begin{cases} X\left(\dfrac{n}{3}\right) & \text{When } n \bmod 3 = 0 \\ Y\left(\dfrac{n-1}{3}\right) & \text{When } n \bmod 3 = 1 \\ Z\left(\dfrac{n-2}{3}\right) & \text{When } n \bmod 3 = 2 \end{cases}$$

Then $$C(n)=F[A(3n-3)]=X(n-1)$$

$$D(n)=F[A(3n-2)]=Y(n-1)$$

$$E(n)=F[A(3n-1)]=Z(n-1)$$

thus, the original architecture 34 is equivalent to the reduced architecture 36. Specifically, it can be seen that interpolators 44 (or up converters) and decimators 46 (or down converters) permit the use of an instantaneous function F to be reduced by a factor of 3.

Returning now to FIG. 2, it can be seen that the present invention also provides for control logic reduction. This feature is particularly important in cases where architecture sharing results in an increase in control logic. Thus, when it is determined that a control logic reduction command has been received at step 48, redundant control logic of the circuit is eliminated and necessary control logic is modified at step 50 such that a reduced logic architecture results.

Figure 4:
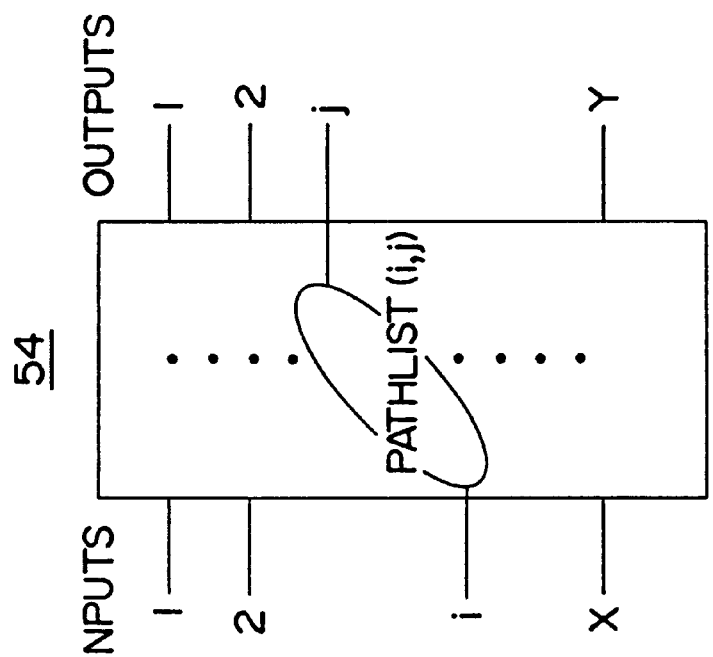
FIG. 4 is a block diagram generally illustrating reduction of control logic in accordance with principles of the present invention.
Figure 4:
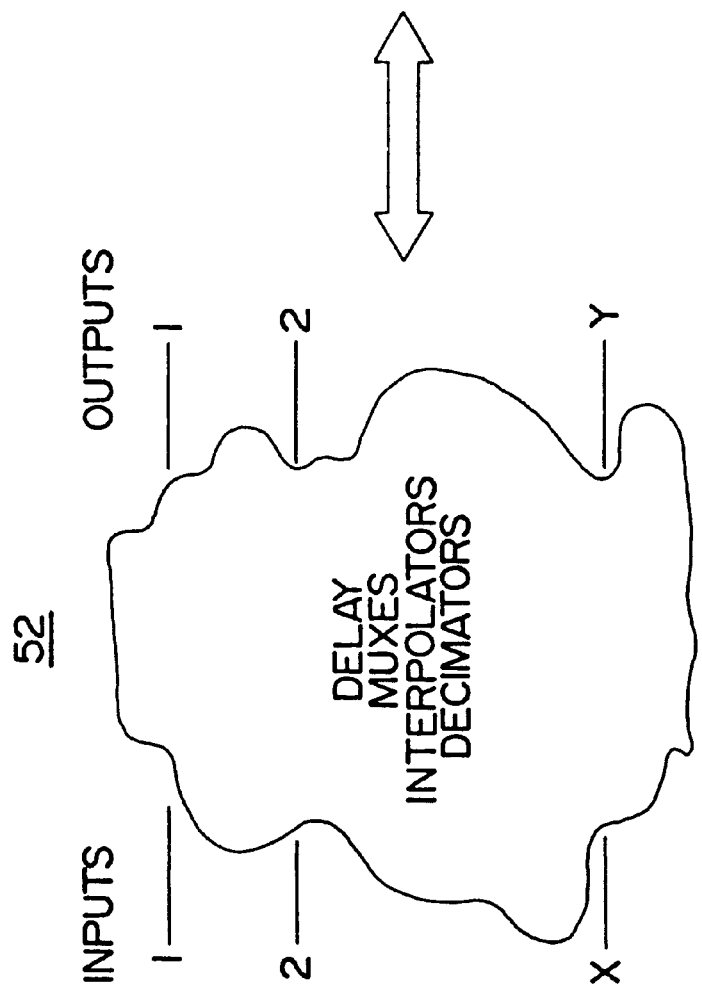
Figure 5A:
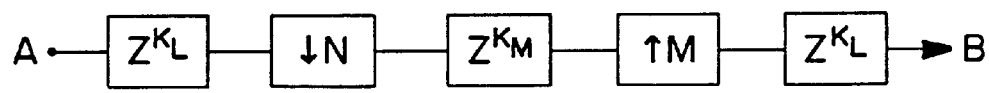
FIG. 5A is a block diagram of a path in accordance with the principles of the present invention.
Figure 5B:
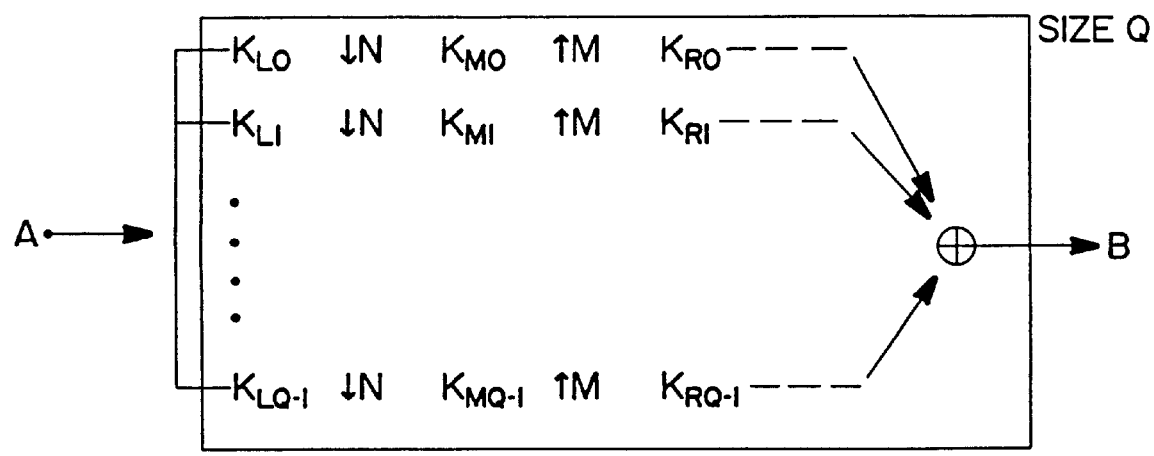
FIG. 5B is a block diagram of a set of parallel paths in accordance with principles of the present invention.

FIG. 4 illustrates the transformation of a general cloud of logic 52 into a rate change component (or reduced logic architecture) 54. It will be appreciated that the cloud of logic 52 contains various rate change components such as delays, multiplexers, interpolators and decimators. It will further be appreciated that the cloud of logic 52 can be defined as a set of path lists interconnecting a set of inputs to a set of outputs. FIGS. 5A and 5B demonstrate a single path 56 and a set of paths 58, respectively. The single path 56 between points A and B is therefore characterized by, $$\boxed{K_L \downarrow N \ K_m \uparrow M \ K_R}\,,$$

corresponding to the single path 56 of FIG. 5A.

A path list is therefore made up of a set of paths 58 from point A to point B such that each path has the same $\downarrow N$ and $\uparrow M$. It will be appreciated that in order to ensure that two outputs do not arrive concurrently, the set of paths 58 in constrained by, (Kri−KRj) MOD M≠O for any i≠j. Thus, a rate change component 54 can be defined as a set of path lists, interconnecting the set of inputs, as shown in FIG. 4.

The various multi-rate components can therefore be represented as interpolation $$\boxed{\uparrow M} \iff \boxed{O \downarrow 1 \ O \ \uparrow M \ O}$$

decimation $$\boxed{\uparrow N} \iff \boxed{O \downarrow N \ O \uparrow 1 \ O}$$

delay $$\boxed{Z^{-K}} \iff \boxed{-K \downarrow 1 \ O \uparrow 1 \ O}$$

or $$\boxed{O \downarrow 1 \ -K \uparrow 1 \ O}$$

-continued or $$\boxed{O \downarrow 1 \ O \uparrow 1 \ -K}$$

Furthermore, FIG. 6 illustrates that a 2-way counter-controlled mux 60 can be given by the counter representation 62. In order to resolve two paths in series we have $$\boxed{K_{L_1} \downarrow N_1 K_{M_1} \uparrow M_1 K_{R_1}} - \boxed{K_{L_2} \downarrow N_2 K_{M_2} \uparrow M_2 K_{R_2}}$$

$$\Updownarrow$$

$$\boxed{K_{Leq} \downarrow N_{eq} K_{M_{eq}} \uparrow M_{eq} K_{R_{eq}}}$$

or

-O-

Specifically, the algorithm is given by

Algorithm:

(1)

$$L \triangleq GCD(M_1, N_2)$$

(2)

$$\text{If}(K_{R1}+K_{L2}) \text{MOD } L \neq O$$

Delete path

Go to "DONE"

$$\overline{M}_1 = \frac{M_1}{L}; \quad \overline{N}_2 = \frac{N_2}{L}; \tag{3}$$

(4) Use Euclid's algorithm to find $P_1$, $P_2$, such that $$P_1\overline{M}_1 + P_2\overline{N}_2 = 1$$

(5) Define the equivalent values for the new path $$K_{Leq} = K_{L1} + N_1 K_{M_1} + \frac{K_{R1} + K_{L2}}{L} P_1 N_1$$

$$K_{Req} = K_{R2} + M_2 K_{M_2} + \frac{K_{R1} + K_{L2}}{L} P_2 M_2$$

$$K_{Meq} = 0$$

$$N_{eq} = N_1 \overline{N}_2$$

$$M_{eq} = \overline{M}_1 M_2$$

(6) "DONE"

Figure 8:
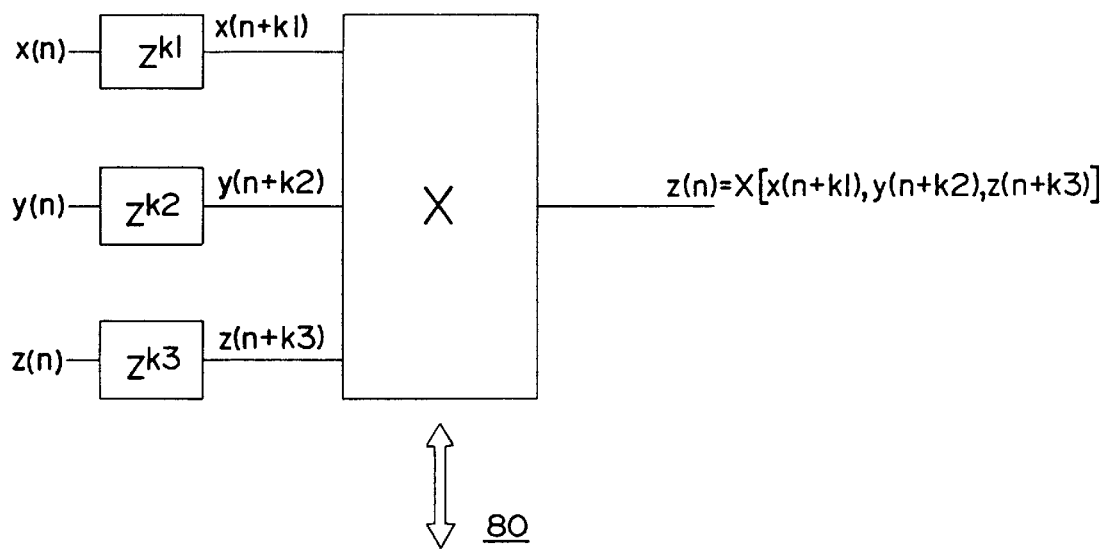
FIG. 8 is a block diagram illustrating delay shifting in accordance with principles of the present invention.
Figure 8:
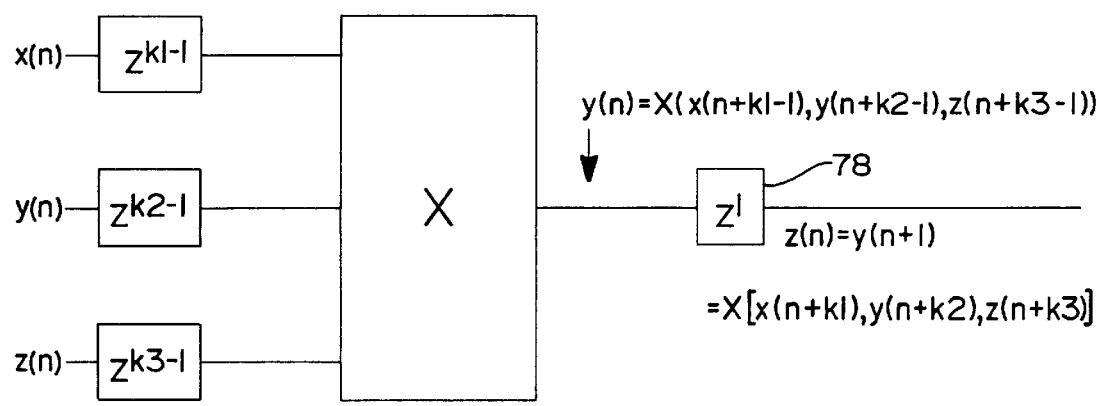

Returning now to FIG. 2, it can be seen that the present invention further provides for determining whether an implementation assignment command has been received at step 64. Step 66 therefore provides for replacing an original component of the circuit with one or more implementation components based on the implementation assignment command. Specifically, FIGS. 7A and 7B illustrate that an original component 68 (although not necessarily a component of the behavioral description) has one or more implementation components 70 that are equivalent to the original component 68. It will be appreciated that the implementation components 70 are contained within the library of foundry primitives and have unambiguous HDL descriptions associated with them. Typically, the implementation components are adders and multipliers. For example, if implementation component 70a is a multiplier that multiplies two 5-bit numbers and produces a 10-bit result, this component can be readily represented in HDL.

returning now to FIG. 2, it can be further be seen that the present invention provides for determining whether a delay shifting command has been received at step 72. Thus, provides for moving a delay component from a first location in the circuit to a second location in the circuit based on the delay shifting command. Specifically, FIG. 8 illustrates the rearrangement of an original architecture 76 by moving a delay component 78 from a first location in the circuit to a second location. Thus, the resulting architecture 80 has a total delay that is maintained.

It is important to note that the hierarchical netlist has a unique file structure that is represented in several equivalent forms throughout the transformation process. It is preferred that an element in the netlist is represented by a N-tuple, defining:

TABLE 1

| Tuple # | Parameter |
| --- | --- |
| 1 | element type |
| 2 | input ports |
| 3 | - from |
| 4 | output ports |
| 5 | - to |
| 6 | level in hierarchy |
| N | context dependent flags |

The design tool architecture therefore accepts inputs at the behavioral level, and automatically generates both compilable code at the HDL level, and C-code for efficient system simulation. When the tool architecture is script driven, automatic transformation of the behavioral description (either block diagram or netlist) into a structural HDL form is possible. In the structural HDL form, realizable foundry library components (such as adders and multipliers) are substituted for idealized components and architecture sharing and bit precision are defined. The automated code generation and associated file structure produced by the tool architecture allow the design time from system concept to delivery of compiled code for the resulting ASIC to be reduced by as much as a factor of 10.

It is important to note that the file structure allows for efficient 2-way travel through the hierarchical netlist when executing the transformations. Furthermore, the tool architecture allows for a systematic hierarchical proof of equivalence at every transformation, rather than requiring a much more complex (and often infeasible) proof of overall equivalence at the completion of compilation. The command sets (i.e., transformations) are preferably script driven, and are intended to be reusable to efficiently optimize a given problem architecture as well as to solve similar functional problems.

Those skilled in the art can now appreciate from the foregoing description that the broad teachings of the present invention can be implemented in a variety of forms. Therefore, while this invention can be described in connection with particular examples thereof, the true scope of the invention should not be so limited since other modifications will become apparent to the skilled practitioner upon a study of the drawings, specification and following claims.

What is claimed is:

1. A computer-implemented method for characterizing a circuit at a hardware level, the method comprising the steps of:

receiving a description of the circuit, the description characterizing the circuit at a behavioral level of a hierarchy;

interpreting a set of predefined computer-based commands requesting desired modifications in the description of the circuit; and generating an electronic file based on the computer-based commands such that the electronic file characterizes the circuit at a hardware level in a desired programming language, the hardware level being at a lower level in the hierarchy than the behavioral level.

2. The method of claim 1 further including the steps of:

generating a hierarchical netlist representing the circuit at each level in the hierarchy;

implementing the desired modifications with a set of predefined modules based on the commands and a library of foundry primitives, the foundry primitives mapping known components to a code set for the desired programming language; and repeatedly updating the hierarchical netlist in accordance with the modifications.

3. The method of claim 2 further including the steps of:

replacing an original component of the circuit residing at an original level in the hierarchy with one or more replacement components residing at a lower level in the hierarchy based on a replacement command; and confirming that the replacement components are functionally equivalent to the original component with regard to the circuit.

4. The method of claim 2 further including the steps of:

reducing an original architecture of the circuit such that a reduced architecture results based on an architecture sharing command; and confirming that the reduced architecture is functionally equivalent to the original architecture with regard to the circuit.

5. The method of claim 2 further including the steps of:

eliminating redundant control logic of the circuit and modifying necessary control logic of the circuit such that a reduced logic architecture results based on a control logic reduction command; and confirming that the reduced logic architecture is functionally equivalent to the redundant control logic and the necessary control logic with regard to the circuit.

6. The method of claim 2 further including the steps of:

replacing an original component of the circuit with one or more implementation components based on an implementation assignment command; and confirming that the implementation components are functionally equivalent to the original component with regard to the circuit.

7. The method of claim 2 further including the steps of:

moving a delay component from a first location in the circuit to a second location in the circuit based on a delay shifting command; and confirming that a total delay from the first location to the second location is maintained with regard to the circuit.

8. The method of claim 1 further including the step of generating a compilable hardware description language file.

9. The method of claim 1 further including the step of generating a C programming language file.

10. The method of claim 1 further including the step of receiving a block diagram.

11. The method of claim 1 further including the step of receiving a descriptive netlist.

12. The method of claim 1 further including the step of characterizing an application specific integrated circuit.

13. The method of claim 1 further including the step of characterizing a field programmable gate array.

14. A computer-implemented method for generating an electronic file, the method comprising the steps of:

implementing desired modifications in a description of a circuit with a set of predefined modules based on computer-based commands and a library of foundry primitives, the foundry primitives mapping known components to code sets for a desired programming language;

generating a hierarchical netlist representing the circuit at each level in a hierarchy; and repeatedly updating the hierarchical netlist in accordance with the modifications.

15. The method of claim 14 further including the steps of:

replacing an original component of the circuit residing at an original level in the hierarchy with one or more replacement components residing at a lower level in the hierarchy based on a replacement command; and confirming that the replacement components are functionally equivalent to the original component with regard to the circuit.

16. The method of claim 14 further including the steps of:

reducing an original architecture of the circuit such that a reduced architecture results based on an architecture sharing command; and confirming that the reduced architecture is functionally equivalent to the original architecture with regard to the circuit.

17. The method of claim 14 further including the steps of:

eliminating redundant control logic of the circuit and modifying necessary control logic of the circuit such that a reduced logic architecture results based on a control logic reduction command; and confirming that the reduced logic architecture is functionally equivalent to the redundant control logic and the necessary control logic with regard to the circuit.

18. The method of claim 14 further including the steps of:

replacing an original component of the circuit with one or more implementation components based on an implementation assignment command; and confirming that the implementation components are functionally equivalent to the original component with regard to the circuit.

19. The method of claim 14 further including the steps of:

moving a delay component from a first location in the circuit to a second location in the circuit based on a delay shifting command; and confirming that a total delay from the first location to the second location is maintained with regard to the circuit.

20. A computer-implemented design tool architecture comprising:

a medium for storing a description of an application specific integrated circuit (ASIC), the description describing the ASIC at a behavioral level of a hierarchy;

a library of foundry primitives, the foundry primitives mapping known ASIC components to code sets for a hardware description language; and a command interpreter for generating an electronic file based on a set of predefined computer-based commands such that the electronic file characterizes the circuit at a hardware level, the hardware level being at a lower level in the hierarchy than the behavioral level.

* * * * *